(12) United States Patent
MacPherson et al.

(10) Patent No.: US 6,235,556 B1
(45) Date of Patent: May 22, 2001

(54) METHOD OF IMPROVING PARALLELISM OF A DIE TO PACKAGE USING A MODIFIED LEAD FRAME

(75) Inventors: John MacPherson, Fremont; Wendy Eng, San Jose, both of CA (US)

(73) Assignee: Clear Logic, Inc., San Jose, CA (US)

(*) Notice: Subject to any disclaimer, the term of this patent is extended or adjusted under 35 U.S.C. 154(b) by 0 days.

(21) Appl. No.: 09/148,818

(22) Filed: Sep. 4, 1998

Related U.S. Application Data

(62) Division of application No. 09/110,787, filed on Jul. 6, 1998.

(51) Int. Cl.$^7$ .................................................. H01L 21/44
(52) U.S. Cl. ............................ 438/118; 438/112; 438/124
(58) Field of Search .................................. 438/106, 111, 438/112, 118, 119, 121, 123, 122, 124

(56) References Cited

U.S. PATENT DOCUMENTS

| | | |
|---|---|---|
| 3,942,245 | 3/1976 | Jackson et al. ........................ 29/591 |
| 4,048,438 | 9/1977 | Zimmerman ........................ 174/68.5 |
| 4,862,246 * | 8/1989 | Masuda et al. ....................... 257/666 |
| 4,942,452 * | 7/1990 | Kitano et al. .......................... 257/666 |
| 5,187,123 | 2/1993 | Yoshida et al. ....................... 437/220 |
| 5,233,222 * | 8/1993 | Djennas et al. ....................... 257/676 |
| 5,378,656 | 1/1995 | Kajihara et al. ...................... 437/217 |
| 5,391,924 * | 2/1995 | Uchida et al. ........................ 257/789 |
| 5,432,380 | 7/1995 | Jin et al. ............................... 257/676 |
| 5,684,328 | 11/1997 | Jin et al. ............................... 257/669 |
| 5,818,103 * | 10/1998 | Harada ................................. 257/676 |

FOREIGN PATENT DOCUMENTS

| | | |
|---|---|---|
| 2195825 * | 4/1988 | (GB) . |
| 1-283840 * | 11/1989 | (JP) . |

* cited by examiner

Primary Examiner—Stephen D. Meier
Assistant Examiner—Jeff Vockrodt
(74) Attorney, Agent, or Firm—Skjerven Morrill & MacPherson LLP; Tom Chen

(57) ABSTRACT

A structure and method are provided to allow a die to be packaged more uniformly and in parallel with a package by utilizing a lead frame having at least one cavity within the lead frame, thereby allowing excess die-attach epoxy can flow into the cavity or cavities and reducing the amount of contact surface area between the die and lead frame.

10 Claims, 2 Drawing Sheets

METHOD OF IMPROVING PARALLELISM OF A DIE TO PACKAGE USING A MODIFIED LEAD FRAME

CROSS-REFERENCE TO RELATED APPLICATIONS

This is a divisional application of U.S. Pat. App. Ser. No. 09/110,787, entitled "A MODIFIED LEAD FRAME FOR IMPROVED PARALLELISM OF A DIE TO PACKAGE", filed Jul. 6, 1998.

BACKGROUND

1. Field of the Invention

This invention relates to the manufacture of semiconductor devices, and more specifically to the process of assembling an integrated circuit into a package.

2. Related Art

Laser fuses have been used in the electronics industry to repair memory elements, configure logic circuits, and customize integrated circuits such as gate arrays by selectively removing desired fuses in the device. For example, a non-functional device can be repaired by removing desired fuses, e.g., ablation by laser, to isolate defective portions of the circuitry or to substitute functionally redundant circuitry for the defective portions. Fuses can also be used to mark the device for identification of characteristics in a manner that is readable visually or electrically, e.g., serialization of the integrated circuit or how the device has been configured by the laser. An integrated circuit can be customized or configured for specific uses by altering the structure, path or electrical characteristics of the device or elements through selective removal of the fuses. It should be noted that the word "fuse" can refer to an antifuse as well as a fuse.

The fuses can be removed at various stages of the integrated circuit manufacturing process. By removing the fuses after the wafer has been sawed up into individual integrated circuits and assembled into packages, the lead time to deliver customized or configured integrated circuits, hereinafter referred to as die, can be reduced. A typical process for assembling a die into a package and configuring the die in the package includes the following basic steps:

1. deposit die-attach epoxy on a lead frame in the cavity of the package, where the cavity can be formed at the time the package is created or at a later time;
2. place the die on the epoxy and compress the die and the package together to distribute the epoxy;
3. bake the package and die to cure the epoxy;
4. attach bond wires between bonding pads on the die and lead fingers on the package;
5. configure the die with the use of a laser; and
6. seal off the top of the package, either with a lid or by filling in the cavity with mold compound.

A major factor limiting the successful application of the laser and configuration of the die in this manner is the difficulty with aligning and focusing the laser if the die does not sit evenly on the lead frame. A die 10 typically has alignment and focusing marks or targets 1–4 on the die's upper surface, as shown in FIG. 1. A typical alignment and focusing sequence for die 10 would begin with a laser scanning targets 1 though 4 one at a time and making x-axis, y-axis, and rotational corrections. The laser then returns to target 1 and makes another series of scans through to target 4 to set the focus level for the entire die 10.

Alignment and focusing in this manner is adequate as long as the die is set evenly upon the lead frame so that the laser scanning plane is parallel with the surface of the die. In other words, as long as any non-orthogonality in the plane of the die, relative to the optics of the laser, does not cause the lasered or scanned portion of the die to fall outside of the laser spot's focus range, proper alignment and focusing can be achieved. However, when the die is not properly placed on the lead frame, the laser may be unable to perform an alignment or focus scan or to accurately ablate the fuses for proper circuit customization.

FIG. 2 shows a die 10, which has been placed and compressed on some die-attach epoxy 20. Epoxy 20 has been deposited on a lead frame (not shown) within a cavity of a package 21. Several factors can cause die 10 to sit at an angle relative to package 21, including the presence of air bubbles 22 within epoxy 20, an uneven distribution of epoxy 20, or an uneven placement of die 10 on epoxy 20. This will often result in a portion of die 10 falling out of the focus range of the laser, which can lead to improper configuration of the die.

Although various leveling mechanisms are common in the industry and would be effective in re-leveling the die, these types of mechanisms are not commonly present in commercially-available lasers used for the repair and configuration of semiconductor devices. Therefore, using these mechanisms to re-level the die so that reliable configuration of the die in a package is possible would require costly and time-consuming modifications to the laser. Accordingly, it is desirable to have a method of accurately adhering a die to a package so that re-leveling the die is unnecessary, which eliminates the additional expenses required to modify the laser for re-leveling.

SUMMARY

The present invention provides a structure and method for accurately adhering a die to a package by modifying the lead frame in the package to allow excess die-attach epoxy to distribute itself into at least one cavity in the lead frame and to reduce the surface area of the lead frame supporting the die. As a result, the amount of epoxy between the die and the lead frame is reduced for less variation in the angle of the die relative to the package, and the die is provided a more rigid and stable setting to minimize the adverse effects of non-uniform epoxy distribution.

In one embodiment of the present invention, the lead frame contains an array of cavities formed in the lead frame, with the array slightly larger than the size of the die to be packaged. When the die is pressed onto the lead frame and die-attach epoxy, the excess epoxy can spread into the cavities. The cavities form a grid in the lead frame which permit the die to be well-supported, yet minimizes the surface contact area, which reduces both the chance of bubble formation and the amount of pressure required to seat the die uniformly on the lead frame. As a result, a more level positioning of the die relative to the lead frame and the package is possible.

In another embodiment of the present invention, a cavity of generally circular or oval shape is formed partially or completely through the lead frame prior to die-attach epoxy deposition. One dimension of the cavity would be slightly smaller than the longer dimension of the die to be packaged. The die-attach epoxy is deposited in the cavity, and the die pressed onto the top of the epoxy and the lead frame. The excess epoxy is forced into unfilled areas of the cavity, and if necessary, through the gaps formed between the edge of die and cavity. The die is well-supported and in direct contact with the lead frame so that the die is positioned parallel with respect to the lead frame and thus the package.

The die-attach epoxy anchors the die firmly in position without affecting the position of the die relative to the lead frame because excess epoxy is not forced between the upper surface of the lead frame and the die.

The present invention permits a more consistent placement of the die in a package which results in better yield for applications where the die is laser-coded in the package.

The present invention will be more fully understood in light of the following detailed description taken together with the accompanying drawings.

BRIEF DESCRIPTION OF DRAWINGS

Note that use of the same reference numbers in different figures indicates the same or like elements.

DETAILED DESCRIPTION

According to the present invention, a structure and method are provided which allow a die to be accurately adhered to a package by creating at least one cavity in the lead frame contained in the package so that the amount of epoxy between the upper surface of the lead frame and the die is reduced, which provides a more rigid and stable setting for the die. Excess die-attach epoxy flows into the cavity or cavities to minimize the effects of non-uniform epoxy distribution along the contact surfaces of the die and epoxy. As a result, the die can be adhered to the package in a manner which allows improved parallelism between the package and die.

Figure 1:
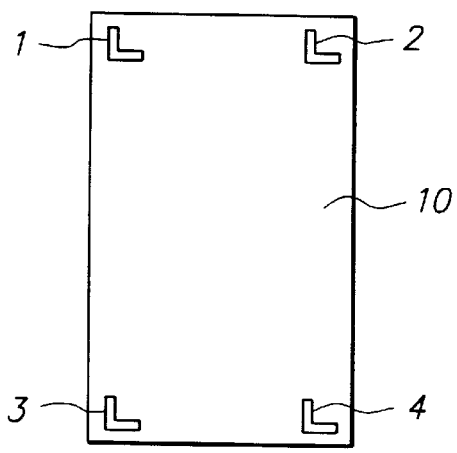
FIG. 1 is a top view of the upper surface of a die showing conventional alignment and focusing targets.
Figure 2:
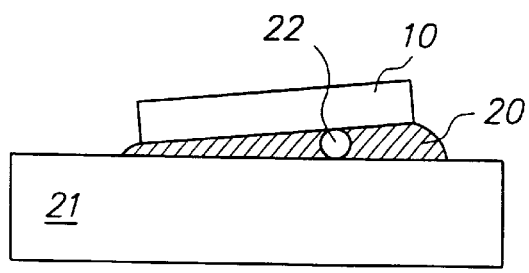
FIG. 2 is a side view of a die mispositioned with respect to a package.
Figure 3A:
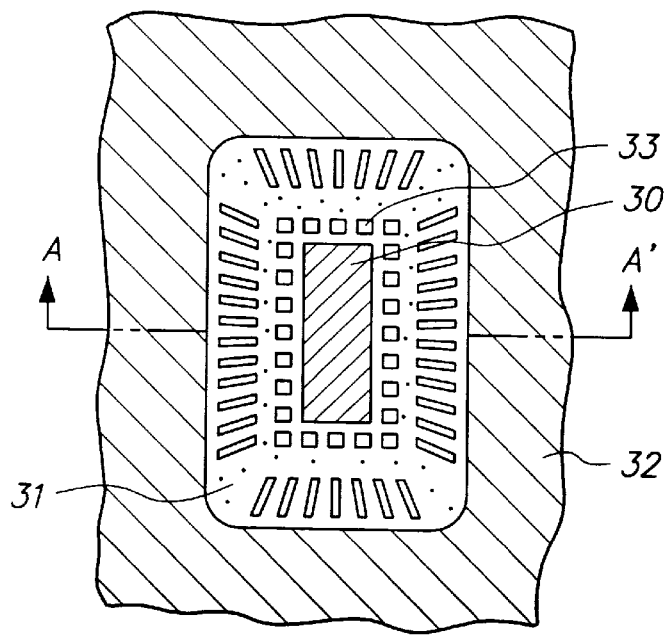
FIGS. 3A and 3B are top and side views, respectively, of a lead frame according to one embodiment of the present invention.
Figure 3B:
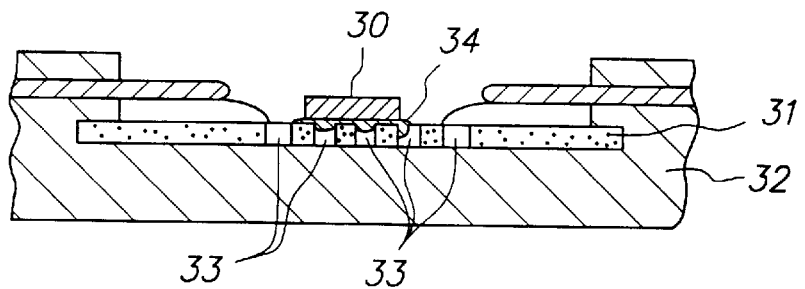

FIGS. 3A and 3B show one embodiment of the present invention, where FIG. 3A is a top view of a die 30 set on a lead frame 31, where lead frame 31 is located within a package 32 and contains an array of rectangular cavities 33. FIG. 3B is a side view of FIG. 3A along sectional line A–A'. Although shown as rectangular cavities 33, other suitably shaped cavities, such as circular, can also be used with this embodiment. The array of cavities 33 formed within lead frame 31 is preferably slightly larger than the size of the die 30 to be placed on the lead frame 31, although not required. A larger array allows excess die-attach epoxy 34 more areas into which to flow. However, a smaller array can also be used with a smaller amount of die-attach epoxy. For example, the epoxy would only be deposited over the array, and not over other areas of the lead frame.

The cavities 33 are cut or formed prior to depositing die-attach epoxy 34, such as at the time the lead frame is manufactured. After cavities 33 have been formed, die-attach epoxy 34 is deposited on lead frame 31. Die 30 is then placed and pressed onto lead frame 31 by any suitable placement mechanism. Excess epoxy 34 spreads into cavities 33 underneath lead frame 31 to allow a more stable placement of die 30 as compared with conventional lead frames that only allow excess epoxy to spread toward the outer edges of the die. Lead frame 31 allows the excess epoxy to spread across less surface area of the die before the die is set, which reduces the likelihood of die mispositioning due to the effects of epoxy spreading.

Forming the lead frame 31 with cavities 33 also forms a grid to support die 30. Because die 30 is supported by a grid rather than by a solid planar surface, there is less surface area where the epoxy is forced between die 30 and lead frame 31. Less epoxy between the supporting surface of the lead frame and the die reduces the effect the epoxy has on stability when the die is pressed against the epoxy. As a result, both the chance of bubble formation and the amount of pressure required to seat the die uniformly on the lead frame are reduced, thereby allowing a more level positioning of the die relative to the lead frame and the package. It should be noted that the size and number of cavities should be such that enough surface area exists on the lead frame to adequately secure the die, and the amount of epoxy used should be such that excess epoxy is not squeezed along the sides of the die and onto the face when the die is placed and secured on the lead frame.

Figure 4A:
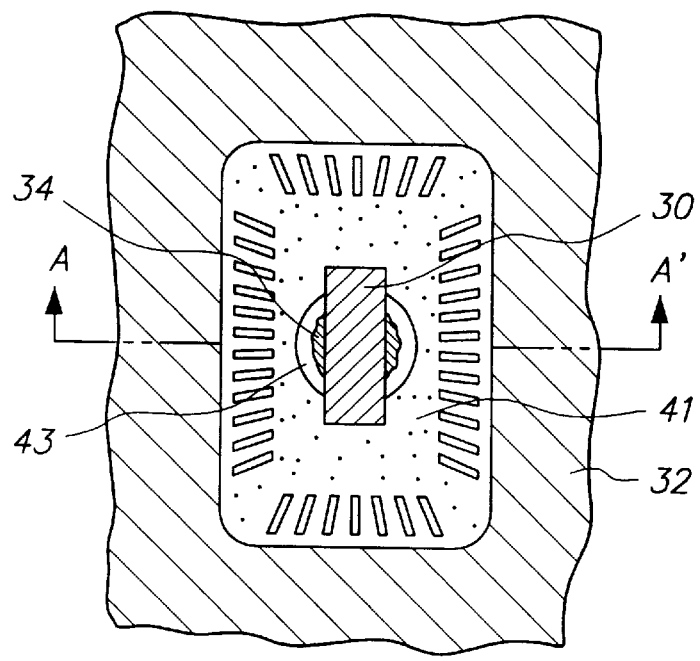
FIGS. 4A and 4B are top and side views, respectively, of a lead frame according to another embodiment of the present invention.
Figure 4B:
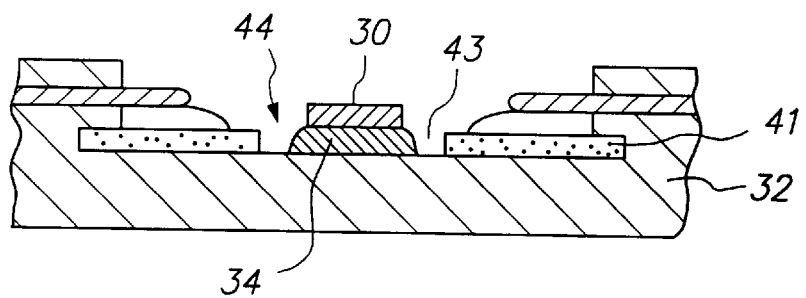

FIGS. 4A and 4B show another embodiment of the present invention, where FIG. 4A is a top view of a die 30 set on a lead frame 41, where lead frame 41 is located within a package 32 and contains a single oval or circular shaped cavity 43. FIG. 4B is a side view of FIG. 4A along sectional line A–A'. Although shown as a general oval or circular shaped cavity 43, other suitably shaped cavities, such as rectangular, can also be used with this embodiment. Cavity 43 formed within lead frame 41 has one dimension slightly smaller than the longer dimension of the die 30 to be placed on the lead frame 41 so that die 30 rests on some portion of lead frame 41. Cavity 43 is shown in FIG. 4B as fully extending through lead frame 41. However, if desired, cavity 43 can extend only partially into lead frame 41, as might be the case if too large a cavity would structurally weaken the lead frame.

Cavity 43 is cut or formed prior to depositing die-attach epoxy 34, such as at the time the lead frame is manufactured. After cavity 43 has been formed, die-attach epoxy 34 is deposited into cavity 43 within lead frame 41. The amount of die-attach epoxy 34 deposited should be such that the epoxy protrudes above the plane of the lead frame. Die 30 is then placed on the top of epoxy 34 and pressed onto lead frame 41 by any suitable placement mechanism. Because the epoxy 34 extends above the plane of the lead frame, epoxy 34 contacts the back surface of the die, and excess epoxy 34 is forced into unfilled portions of cavity 43 underneath lead frame 41. If epoxy 34 has spread and filled cavity 43, additional excess epoxy 34 can spread out through openings 44 between the edge of die 30 and the edge of cavity 43.

Because die 30 can be pressed and set directly on lead frame 41, without epoxy between die 30 and the upper surface of lead frame 41, die 30 remains parallel with lead frame 41, and thus package 32. Furthermore, because the size of cavity 43 is slightly smaller than die 30 so that only a small portion of die 30 is in direct contact with lead frame 41, a large amount of epoxy 43 is available to contact a large area of die 30, thereby ensuring adequate adhesion. Consequently, dies can be packaged into lead frames with minimal or negligible positioning errors caused by the die-attach epoxy.

The above-described embodiments of the present invention are merely meant to be illustrative and not limiting. It will thus be obvious to those skilled in the art that various changes and modifications may be made without departing from this invention in its broader aspects. For example, any suitable number and shape of cavities can be formed within a lead frame in accordance with either of the two embodiments discussed above to realize the benefits of the present invention. Therefore, the appended claims encompass all such changes and modifications as fall within the true spirit and scope of this invention.

We claim:

1. A method for packaging a die, comprising:

forming at least one cavity through an upper surface of a lead frame;

depositing die-attach epoxy between the upper surface of the lead frame and the die; and placing said die approximately centrally over the at least one cavity and over at least two opposing edges of said at least one cavity to force excess amounts of said die-attach epoxy into said at least one cavity, wherein at least one edge of said at least one cavity lies laterally outside at least one side of the die, and wherein said at least one cavity extends completely through said lead frame.

2. The method of claim 1, wherein said epoxy is deposited so that a portion of said epoxy is above the upper surface of said lead frame.

3. A method for packaging a die, comprising:

forming at least two cavities to create an array of said cavities through an upper surface of a lead frame;

depositing die-attach epoxy between the upper surface of the lead frame and the die; and placing said die approximately centrally over the at least one cavity and over at least two opposing edges of said at least one cavity to force excess amounts of said die-attach epoxy into said at least one cavity, wherein at least one edge of said at least one cavity lies laterally outside at least one side of the die.

4. The method of claim 3, wherein said die-attach epoxy is only deposited over said array.

5. The method of claim 3, wherein at least one dimension of said array is slightly larger than at least one dimension of said die.

6. The method of claim 3, wherein said cavities are rectangular shaped.

7. A method for packaging a die, comprising:

forming a single cavity through an upper surface of a lead frame, wherein said cavity is circular shaped;

depositing die-attach epoxy between the upper surface of the lead frame and the die; and placing said die approximately centrally over the at least one cavity and over at least two opposing edges of said at least one cavity to force excess amounts of said die-attach epoxy into said at least one cavity, wherein at least one edge of said at least one cavity lies laterally outside at least one side of the die.

8. The method of claim 7, wherein at least one dimension of said cavity is slightly smaller than at least one dimension of said die.

9. A method for packaging a die, comprising:

forming a single cavity through an upper surface of a lead frame, wherein said cavity is oval shaped;

depositing die-attach epoxy between the upper surface of the lead frame and the die; and placing said die approximately centrally over the at least one cavity and over at least two opposing edges of said at least one cavity to force excess amounts of said die-attach epoxy into said at least one cavity, wherein at least one edge of said at least one cavity lies laterally outside at least one side of the die.

10. The method of claim 9, wherein at least one dimension of said cavity is slightly smaller than at least one dimension of said die.

* * * * *